US011404500B2

(12) United States Patent
Bu et al.

(10) Patent No.: US 11,404,500 B2
(45) Date of Patent: Aug. 2, 2022

(54) DISPLAY APPARATUS AND DISPLAY CONTROL METHOD

(71) Applicants: BEIJING BOE DISPLAY TECHNOLOGY CO., LTD., Beijing (CN); BOE Technology Group Co., Ltd., Beijing (CN)

(72) Inventors: Qianqian Bu, Beijing (CN); Hong Yang, Beijing (CN); Weipin Hu, Beijing (CN); Pingqi Zhang, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/279,601

(22) PCT Filed: Jul. 14, 2020

(86) PCT No.: PCT/CN2020/101940
§ 371 (c)(1),
(2) Date: Mar. 25, 2021

(87) PCT Pub. No.: WO2021/012994
PCT Pub. Date: Jan. 28, 2021

(65) Prior Publication Data
US 2022/0028941 A1    Jan. 27, 2022

(30) Foreign Application Priority Data

Jul. 24, 2019    (CN) .......................... 201910673124.9

(51) Int. Cl.
*H01L 27/32*    (2006.01)
*G09G 3/3208*    (2016.01)
(Continued)

(52) U.S. Cl.
CPC ....... *H01L 27/3232* (2013.01); *G09G 3/3208* (2013.01); *H01L 51/0097* (2013.01);
(Continued)

(58) Field of Classification Search
CPC .............. G09G 3/3208; H01L 27/3232; H01L 51/0097; H01L 51/5206; H01L 51/5234;
(Continued)

(56) References Cited

U.S. PATENT DOCUMENTS 8,928,217 B2    1/2015    Choung et al.
9,219,251 B2    12/2015    Kang et al.
(Continued)

FOREIGN PATENT DOCUMENTS

CN    1533512 A    9/2004
CN    2771895 Y    4/2006
(Continued)

OTHER PUBLICATIONS

International Search Report for PCT/CN2020/101940 dated Oct. 21, 2020.
(Continued)

*Primary Examiner* — Afroza Chowdhury
(74) *Attorney, Agent, or Firm* — Ling Wu; Stephen Yang; Ling and Yang Intellectual Property

(57) ABSTRACT

A display apparatus and a display control method are provided. The display apparatus includes an organic light-emitting display device having electrostatic attraction and including a transparent cathode layer and a transparent anode layer, so that the organic light-emitting display device can achieve bidirectional light emission; frustrated total reflection devices positioned on both sides of the organic light-emitting display device respectively and each including an active film layer and a frustrated switch, wherein the frustrated switch is turned on or off according to a received
(Continued)

control signal to control whether the active film layer has electrostatic attraction; and a sealant bonded between the organic light-emitting display device and the frustrated total reflection devices to form a gap therebetween. When the active film layer has electrostatic attraction, the light emitted by the organic light-emitting display device is emitted from the active film layer.

16 Claims, 4 Drawing Sheets

(51) Int. Cl.
*H01L 51/00* (2006.01)
*H01L 51/52* (2006.01)

(52) U.S. Cl.
CPC ...... *H01L 51/5206* (2013.01); *H01L 51/5234* (2013.01); *H01L 2251/5323* (2013.01); *H01L 2251/5338* (2013.01)

(58) Field of Classification Search
CPC ............... G01N 2333/62; G01N 33/49; G01N 33/6848; G01N 33/74; H01J 49/004
See application file for complete search history.

(56) References Cited

U.S. PATENT DOCUMENTS

| | | |
|---|---|---|
| 2005/0018272 A1 | 1/2005 | Kimura |
| 2013/0242212 A1* | 9/2013 | Huang ................ H01L 51/5281 313/504 |
| 2018/0190748 A1 | 7/2018 | Im |
| 2019/0252633 A1 | 8/2019 | Cheng et al. |

FOREIGN PATENT DOCUMENTS

| | | |
|---|---|---|
| CN | 202487668 U | 10/2012 |
| CN | 108258014 A | 7/2018 |
| CN | 108336122 A | 7/2018 |
| CN | 108346683 A | 7/2018 |
| CN | 109728190 A | 5/2019 |
| CN | 110350016 A | 10/2019 |

OTHER PUBLICATIONS

Office Action dated Feb. 24, 2021 for Chinese Patent Application No. 201910673124.9 and English Translation.
Office Action dated Aug. 31, 2021 for Chinese Patent Application No. 201910673124.9 and English Translation.

* cited by examiner

DISPLAY APPARATUS AND DISPLAY CONTROL METHOD

The present application claims the priority of Chinese Patent Application No. 201910673124.9 filed to the CNIPA on Jul. 24, 2019, entitled "Display Apparatus and Display Control Method", the content of which is hereby incorporated into the present application by reference.

TECHNICAL FIELD

Embodiments of the present disclosure relate to, but are not limited to, the technical field of display, in particular to a display apparatus and a display control method.

BACKGROUND

Organic Light-Emitting Diode (OLED) display technology has obvious advantages: OLED self-emits light, so it does not need backlight, and its thickness is obviously lower than that of liquid crystal display panel; OLED has excellent flexibility and can be folded and bent; and OLED also has advantages in response time, viewing angle and power consumption.

The current OLED display apparatuses are mostly single-sided display, but with the development of science and technology and the improvement of people's requirements for products, the fact that display apparatuses can only achieve single-sided display can no longer meet the increasing display requirements. At present, the display apparatuses which can achieve double-sided display mainly adopt two display panels, and control the two display panels respectively to achieve double-sided display. These display apparatuses can achieve the switching of display sides, but they have complex structure and high production cost.

SUMMARY

The following is a summary of subject matter described in detail herein. This summary is not intended to limit the protection scope of the claims.

Embodiments of the present disclosure provide a display apparatus and a display control method.

In a first aspect, an embodiment of the present disclosure provides a display apparatuses including:

an organic light-emitting display device with electrostatic attraction, including a transparent cathode layer, a transparent anode layer and an organic light-emitting layer positioned between the transparent cathode layer and the transparent anode layer;

frustrated total reflection devices positioned on both sides of the organic light-emitting display device respectively and each including an active film layer and a frustrated switch electrically connected with the active film layer, wherein the frustrated switch is configured to be turned on or off according to a received control signal to control whether the active film layer has electrostatic attraction or not, and the control signal includes a turn-on signal or a turn-off signal; and sealants bonded between the organic light-emitting display device and the frustrated total reflection devices, to form gaps between the frustrated total reflection devices and the organic light-emitting display device;

wherein when the active film layer has electrostatic attraction, the active film layer and the display device are in an adsorption state, so that light emitted by the organic light-emitting display device is emitted from the active film layer; and when the active film layer does not have electrostatic attraction, there is a gap between the active film layer and the display device, so that light emitted by the organic light-emitting display device is totally reflected by the gap.

In an exemplary embodiment, the organic light-emitting display device further includes a substrate positioned on a side of the transparent anode layer away from the transparent cathode layer; an encapsulation structure positioned on a side of the transparent cathode layer away from the transparent anode layer; and an electrical adsorption layer positioned on a side of the substrate away from the encapsulation structure and/or on a side of the encapsulation structure away from the substrate, wherein the electrical adsorption layer is maintained at a set potential when the organic light-emitting display device is emitting light, so that the organic light-emitting display device has electrostatic attraction.

In an exemplary embodiment, the transparent cathode layer is reused as an electrical adsorption layer, which is maintained at a set potential when the organic light-emitting display device is emitting light, so that the organic light-emitting display device has electrostatic attraction.

In an exemplary embodiment, the active film layer includes a flexible substrate; a transparent conductive layer positioned on a side of the flexible substrate close to the organic light-emitting display device; a plurality of micromirror units positioned between the flexible substrate and the transparent conductive layer and protruding toward the transparent conductive layer; and an insulating layer positioned on a side of the transparent conductive layer away from the flexible substrate; wherein the transparent conductive layer is electrically connected with the frustrated switch.

In an exemplary embodiment, the material of the micromirror unit includes an organic material with a refractive index of 1.2 to 1.7.

In an exemplary embodiment, the height of the micromirror unit is 2 to 10 microns. In an exemplary embodiment, the distance between two adjacent micromirror units is 2 to 10 microns.

In an exemplary embodiment, the active film layer further includes a passivation layer positioned between the flexible substrate and the micromirror unit.

In an exemplary embodiment, the gap is sealed and in a vacuum state.

In an exemplary embodiment, in the direction of the organic light-emitting display device toward the active film layer, the width of the gap is 10 to 100 microns.

In a second aspect, an embodiment of the present disclosure provides a display control method for controlling the display apparatus to display, the display apparatus including a first display surface and a second display surface respectively corresponding to the two frustrated total reflection devices, the display control method including:

controlling the organic light-emitting display device to emit light according to a display screen and enabling the organic light-emitting display device to have electrostatic attraction;

receiving display surface designation information, wherein the display surface designation information includes the first display surface and/or the second display surface; and sending a control signal to two frustrated switches respectively according to the display surface designation information to control whether the corresponding active film layer has electrostatic attraction, thereby controlling the first display surface and/or the second display surface of the display apparatus to display the display screen, wherein the control signal includes a turn-on signal or a turn-off signal.

In an exemplary embodiment, the first display surface is a main display surface, and when the display surface designation information includes the first display surface and the second display surface, the display control method further includes: mirroring the display screen displayed on the second display surface.

In an exemplary embodiment, when the organic light-emitting display device further includes a substrate positioned on a side of the transparent anode layer away from the transparent cathode layer, an encapsulation structure positioned on a side of the transparent cathode layer away from the transparent anode layer, and an electrical adsorption layer positioned on a side of the substrate away from the encapsulation structure and/or on a side of the encapsulation structure away from the substrate, the step of controlling the organic light-emitting display device to emit light according to the display screen and enabling the organic light-emitting display device to have electrostatic attraction includes:

controlling the organic light-emitting display device to emit light according to the display screen; and
    controlling the electrostatic adsorption layer to be maintained at a set potential so that the organic light-emitting display device has electrostatic attraction.

In an exemplary embodiment, when the transparent cathode layer is reused as an electrical adsorption layer, the step of controlling the organic light-emitting display device to emit light according to the display screen and enabling the organic light-emitting display device to have electrostatic attraction includes:

controlling the transparent cathode layer to be maintained at a set potential so that the organic light-emitting display device has electrostatic attraction; and
    controlling the organic light-emitting display device to emit light according to the display screen by controlling a potential input to the transparent anode layer.

Additional aspects and advantages of the present disclosure will be set forth in part in the following description, and will be apparent from the description, or may be learned through practice of the present disclosure.

Other aspects will become apparent upon reading and understanding accompanying drawings and the detailed description.

BRIEF DESCRIPTION OF DRAWINGS

The above and/or additional aspects and advantages of the present disclosure will become apparent and easily understood from the following description of embodiments with reference to the accompanying drawings, wherein.

DETAILED DESCRIPTION

Figure 1:
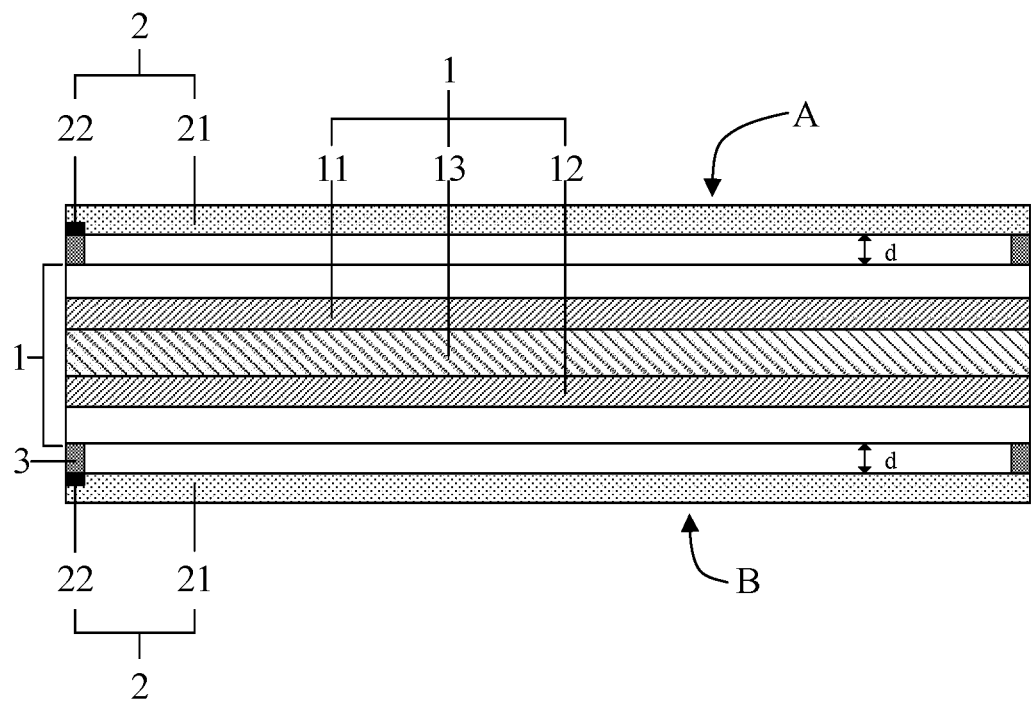
FIG. 1 is a schematic structural diagram of a display apparatus according to an embodiment of the present disclosure.

The present disclosure will be described in detail below. Examples of embodiments of the present disclosure are shown in the accompanying drawings, wherein the same or similar reference signs indicate the same or similar components or components with the same or similar functions. In addition, if a detailed description of known arts is unnecessary when illustrating the features of the present disclosure, such detailed description is omitted. The embodiments described below with reference to the drawings are exemplary, and are merely intended to explain the present disclosure, and cannot be interpreted as limiting the present disclosure.

It will be understood by those skilled in the art that unless otherwise defined, all terms (including technical terms and scientific terms) used herein have the same meanings as those generally understood by those skilled in the art to which the present disclosure pertains. It should also be understood that terms such as those defined in a general dictionary should be construed to have meanings consistent with those in the context of the related technology, and will not be interpreted in idealized or overly formal meanings unless specifically defined herein.

It will be understood by those skilled in the art, the singular forms "a", "an", "said" and "the" used herein may also include plural forms unless expressly stated. It should be further understood that the phase "including" used in the specification of the present disclosure means the presence of stated features, integers, acts, operations, elements and/or components, but does not exclude the presence or addition of one or more other features, integers, acts, operations, elements, components and/or groups thereof. It should be understood that when stating that an element is "connected" or "coupled" to another element, such element may be directly connected or coupled to other elements, or there may be intermediate elements. In addition, "connected" or "coupled" used herein may include wireless connection or wireless coupling. The phrase "and/or" as used herein includes all or any unit of and all combinations of one or more associated items listed herein.

Firstly, several nouns involved in the present disclosure are introduced and explained:

1) Total reflection: also known as total internal reflection. When light enters an optically thinner medium from an optically denser medium, if the incident angle is greater than a certain critical angle θ (the light is far from the normal), the refracted light will disappear, and all the incident light will be reflected without entering the optically thinner medium. It should be noted that "optically denser medium" and "optically thinner medium" are defined relative to each other, wherein the refractive index of the optically denser medium is higher than that of the optically thinner medium.

2) Frustrated total reflection: based on total reflection, when the optically thinner medium is very thin, total reflection will be suppressed, that is, part of light may escape from the optically thinner medium. Generally, when the thickness of the optically thinner medium is within the wavelength range of incident light, the total reflection is obviously suppressed, but when the thickness of the optically thinner medium exceeds the wavelength of input light, the frustrated total reflection is weakened or even the total reflection is not suppressed.

3) Electrostatic attraction: there is an interaction between charged bodies with opposite electrical properties, and the magnitude of the acting force is proportional to the product of their charged quantities and inversely proportional to the square of the distance between them. This interaction is called electrostatic attraction.

At present, the display apparatuses which can achieve double-sided display mainly adopt two display panels and control the two display panels respectively to achieve double-sided display. Although these display apparatuses can achieve the switching of display sides, they have complex structure and high production cost.

Hereinafter, the display apparatus and the display control method provided by the technical schemes of the present disclosure will be described in detail through embodiments.

Figure 2:
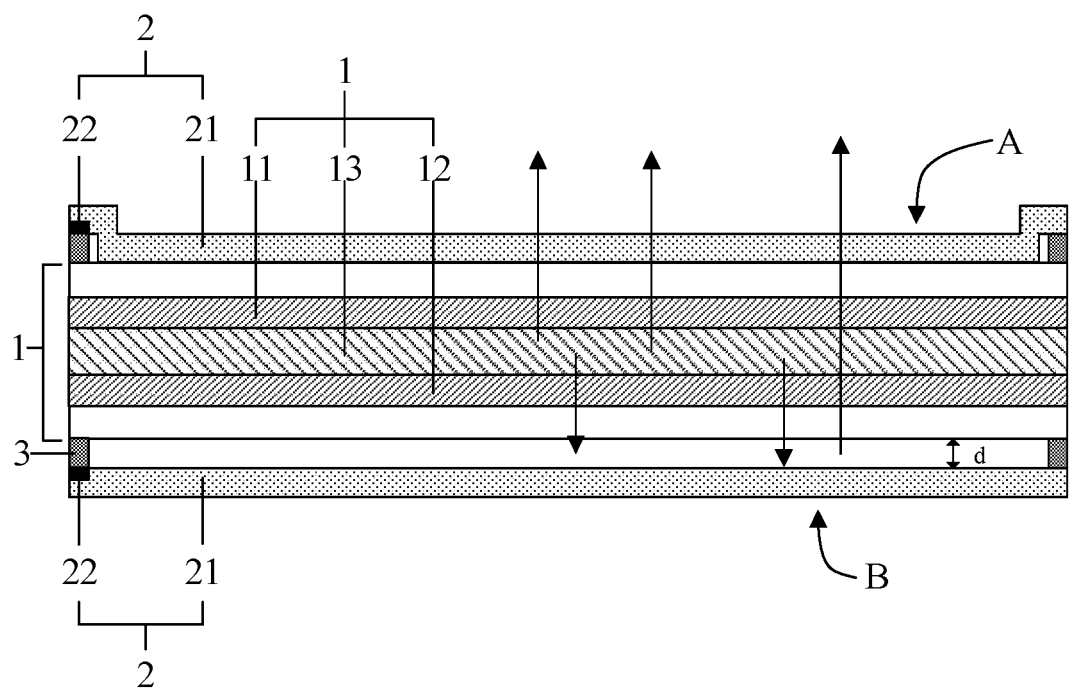
FIG. 2 is a schematic structural diagram of a display apparatus provided by an embodiment of the present disclosure with a first display surface is in a display state.

In an exemplary embodiment, a display apparatus is provided. Referring to FIGS. 1 and 2, the display apparatus includes:

an organic light-emitting display device 1, having electrostatic attraction and including a transparent cathode layer 11, a transparent anode layer 12 and an organic light-emitting layer 13 positioned between the transparent cathode layer 11 and the transparent anode layer 12;

frustrated total reflection devices 2, positioned on both sides of the organic light-emitting display device 1 respectively, and each includes an active film layer 21 and a frustrated switch 22 electrically connected with the active film layer 21, wherein the frustrated switch 22 is configured to be turned on or off according to a received control signal to control whether the active film layer 21 has electrostatic attraction or not, and the control signal includes a turn-on signal or a turn-off signal; and a sealant 3, bonded between the organic light-emitting display device 1 and the frustrated total reflection device 2, which enables a gap d to be formed between the frustrated total reflection device 2 and the organic light-emitting display device 1.

Wherein when the active film layer 21 has electrostatic attraction, the active film layer 21 and the organic light-emitting display device 1 are in an adsorption state, so that the light emitted by the organic light-emitting display device 1 is emitted from the active film layer 21; and when the active film layer 21 has no electrostatic attraction, there is a gap d between the active film layer 21 and the organic light-emitting display device 1, so that the light emitted by the organic light-emitting display device 1 is totally reflected by the gap d.

As used in this disclosure, "the organic light-emitting display device 1 has electrostatic attraction" means that the organic light-emitting display device 1 has the ability to interact with another structure so that electrostatic attraction exists between them. In the same way, "the active film layer 21 has electrostatic attraction" also means that the active film layer 21 has the ability to interact with another structure so that electrostatic attraction exists between them.

The present disclosure is achieved by using the principle of frustrated total reflection, and the application of the principle of frustrated total reflection in the present disclosure will be described in detail with reference to FIG. 2. In the present disclosure, both the organic light-emitting display device 1 and the active film layer 21 may be regarded as an optically denser medium, and the gap d may be regarded as an optically thinner medium. The two display surfaces of the display apparatus include a first display surface A and a second display surface B.

As shown in FIG. 2, the organic light-emitting display device 1 and the active film layer 21 on an upper side of the organic light-emitting display device 1 are in an adsorption state, and the gap d between the active film layer 21 and the organic light-emitting display device 1 in the adsorption state is compressed, i.e., the thickness of the gap d is obviously reduced or even reduced to zero, so that total reflection is suppressed. Therefore, the light emitted by the organic light-emitting display device 1 may be incident on and emitted from the active film layer 21. At this time, the first display surface A of the display apparatus is in a display state.

The organic light-emitting display device 1 and the active film layer 21 positioned on a lower side of the organic light-emitting display device 1 are in a non-adsorption state, and the gap d between the active film layer 21 and the organic light-emitting display device 1 in the non-adsorption state is not compressed, so that the light emitted by the organic light-emitting display device 1 is totally reflected by the gap d. Therefore, the light emitted by the organic light-emitting display device 1 cannot be incident on the active film layer 21 due to total reflection, and thus will not be emitted from the active film layer 21. At this time, the second display surface B of the display apparatus is in a non-display state. At this time, although the gap d between the organic light-emitting display device 1 and the active film layer 21 on the lower side thereof consumes a part of light, some light is still reflected back to the organic light-emitting display device 1 and emitted from the first display surface A for display.

It should be understood that FIG. 2 is only an example of a display state, that is, the first display surface A is in a display state while the second display surface B is in a non-display state. Actually, since two active film layers 21 are respectively controlled by two frustrated switches 22, it is possible to control whether the corresponding active film layers 21 are adsorbed with the organic light-emitting display device 1 according to requirements, so as to control the first display surface A and/or the second display surface B of the display apparatus to display.

According to the display apparatus provided in this embodiment, the cathode layer and the anode layer of the organic light-emitting display device are prepared by using transparent materials, so that the organic light-emitting display device has two opposite display surfaces. A suppressed total reflection device is provided on respective sides of the two display surfaces of the organic light-emitting display device that are away from each other, and a gap is formed by bonding the frustrated total reflection device and the organic light-emitting display device with a sealant. The frustrated total reflection device includes a frustrated switch and an active film layer. Whether the light emitted by the organic light-emitting display device can be emitted from the corresponding active film layer may be controlled by controlling the on and off of the corresponding frustrated switch, which not only provides a double-sided display apparatus with simple structure, but also can achieve the controllable switching of single/dual display surfaces of the display apparatus.

Optionally, referring to FIG. 1 or 2, the gap d is sealed and in a vacuum state. The "vacuum state" in the embodiment of the present disclosure does not mean that there is no substance in the gap d, but that the air pressure of the gap d is lower than 1 atm (1 standard atmospheric pressure). Of course, in order to achieve adsorption between the organic light-emitting display device 1 and the active film layer 21 with lower power consumption, the air pressure in the gap d may be selected to be lower than 0.8 atm or even lower.

Optionally, referring to FIG. 1 or 2, in the direction of the organic light-emitting display device 1 toward the active film layer 21, the width of the gap d is 10 to 100 microns. Because the wavelength range of visible light is 380-780 nm, and when the width of the gap d is 10-100 microns, the width of the gap d is much larger than the wavelength of light emitted by the organic light-emitting display device 1, so it can be ensured that the gap d totally reflects the light emitted by the organic light-emitting display device 1 when the organic light-emitting display device 1 and the active film layer 21 in the non-adsorption state. Moreover, since the width of the gap d is within the above range, the resistance that the active film layer 21 needs to overcome when adsorbing with the organic light-emitting display device 1 is small, thereby reducing the power consumption for achieving the adsorption of the active film layer 21 with the organic light-emitting display device 1. In addition, when the width of the gap d is within the above range, even if the gap d is affected by some external factors (such as sudden increase of ambient air pressure, electrostatic charge of the active film layer 21 due to friction, etc.), the width of the gap d will not be easily lower than the wavelength of visible light, thereby ensuring that the total reflection of the light emitted by the organic light-emitting display device 1 by the gap d will not be suppressed due to the influence of external factors.

Referring to FIG. 1 or 2, the frustrated switch 22 may be a Thin-Film Transistor (TFT) or other switch tubes. Although not shown in the figure, in fact, the organic light-emitting display device 1 further includes TFT arranged in an array. Both the transparent cathode layer 11 and the transparent anode layer may be made of transparent conductive materials such as indium tin oxide or zinc aluminum oxide.

Referring to FIG. 1 or 2, although not shown in the figure, there may be an electron transport layer between the transparent cathode layer 11 and the organic light-emitting layer, and a hole injection layer and a hole transport layer between the transparent anode layer 12 and the organic light-emitting layer 13, wherein the hole injection layer is on a side of the hole transport layer away from the organic light-emitting layer. The addition of the above multiple layers is beneficial to improving the luminous efficiency of the organic light-emitting display device 1.

Figure 3:
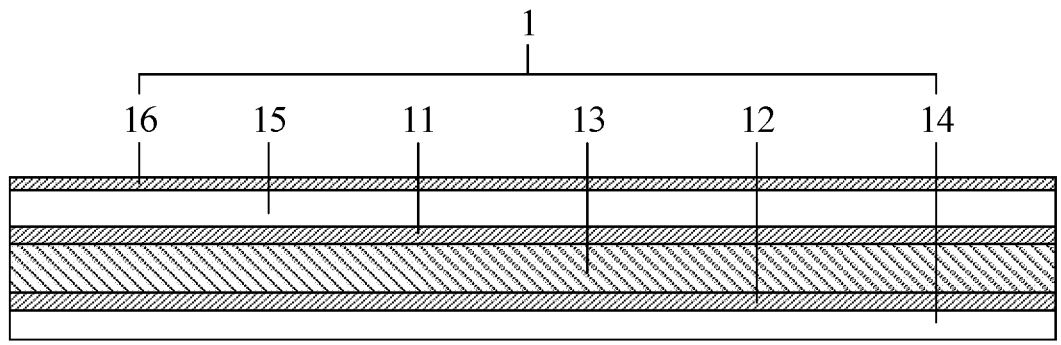
FIG. 3 is a schematic structural diagram of an organic light-emitting display device provided by an embodiment of the present disclosure.

Referring to FIG. 3, optionally, the organic light-emitting display device further includes a substrate 14, an encapsulation structure 15 and an electrical adsorption layer 16. The substrate 14 is positioned on a side of the transparent anode layer 12 away from the transparent cathode layer 11. The encapsulation structure 15 is positioned on a side of the transparent cathode layer 11 away from the transparent anode layer 12. The electrical adsorption layer 16 is positioned on a side of the substrate 14 away from the encapsulation structure 15 (not shown in the figure) and/or on a side of the encapsulation structure 15 away from the substrate 14, and the electrical adsorption layer 16 is maintained at a set potential to enable the organic light-emitting display device 1 to have electrostatic attraction.

As shown in FIG. 3, the electrical adsorption layer 16 is positioned on a side of the encapsulation structure 15 away from the substrate 14. At this time, referring to FIG. 1 or 2, since the distances between the electrical adsorption layer 16 and the two active film layers 21 are different, in order to make the two active film layers 21 to adsorb the organic light-emitting display device 1 better, the two active film layers 21 may be maintained at different potentials. Of course, when the electrical adsorption layer 16 is positioned on the side of the substrate 14 away from the encapsulation structure 15, in order to make the two active film layers 21 to adsorb the organic light-emitting display device 1 better, the two active film layers 21 may be maintained at different potentials.

For example, the difference between the potential of the active film layer 21 closer to the electrical adsorption layer 16 and the set potential of the electrical adsorption layer 16 is smaller than the difference between the potential of the active film layer 21 farther from the electrical adsorption layer 16 and the set potential of the electrical adsorption layer 16. According to the principle that objects with opposite charges can attract each other, the potential maintained by the active film layer 21 has opposite electrical properties to the set potential of the electrical adsorption layer 16.

When the electrical adsorption layer 16 is positioned on the side of the substrate 14 away from the encapsulation structure 15 and on the side of the encapsulation structure 15 away from the substrate 14, respectively, because the distances between the two active film layers 21 and the nearest electrical adsorption layer 16 are basically the same, so when the set potentials of the electrical adsorption layers 16 are the same, the potentials maintained by the two active film layers 21 may be the same.

In an exemplary embodiment, the encapsulation structure 15 may be a glass encapsulation structure or a Thin Film Encapsulation (TFE) structure. When the encapsulation structure 15 is a TFE structure, the display apparatus may be used as a flexible display apparatus.

Figure 4:
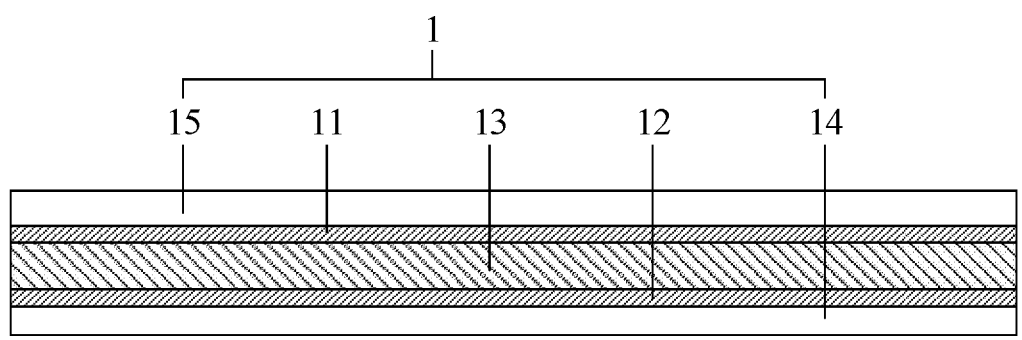
FIG. 4 is a schematic structural diagram of another organic light-emitting display device provided by an embodiment of the present disclosure.

Referring to FIG. 4, optionally, the organic light-emitting display device 1 may not be additionally provided with an electrical adsorption layer, but the transparent cathode layer 11 is reused as an electrical adsorption layer, and the transparent cathode layer 11 is maintained at a set potential when the organic light-emitting display device 1 is emitting light, so that the organic light-emitting display device 1 has electrostatic attraction. Referring to FIG. 1 or 2, since the transparent cathode layer 11 will be maintained at a constant potential when the organic light-emitting display device 1 is emitting light, adsorption can be achieved as long as the constant potential maintained by the transparent cathode layer 11 is non-zero and the electrical property of the potential of the active film layer 21 is opposite to the electrical property of the set potential of the transparent cathode layer 11. Reusing the transparent cathode layer 11 as an electrical adsorption layer is beneficial to simplifying the film-layer structure of the organic light-emitting display device 1 and reducing the production cost.

Figure 5:
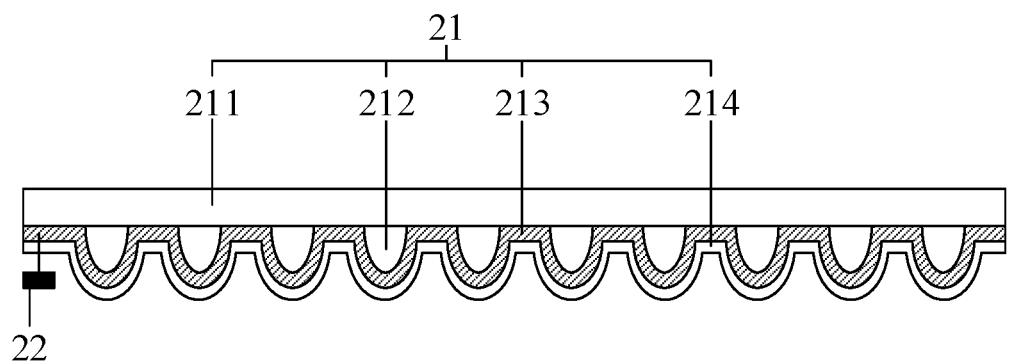
FIG. 5 is a schematic structural diagram of a frustrated total reflection device provided by an embodiment of the present disclosure.

Optionally, referring to FIG. 5, the active film layer 21 includes a flexible substrate 211, a plurality of micromirror units 212, a transparent conductive layer 213 and an insulating layer 214. Referring to FIG. 1 or 2, the transparent conductive layer 213 is positioned on a side of the flexible substrate 211 close to the organic light-emitting display device 1; the plurality of micromirror units 212 are positioned between the flexible substrate 211 and the transparent conductive layer 213 and protrude toward the transparent conductive layer 213; the insulating layer 214 is positioned on a side of the transparent conductive layer 213 away from the flexible substrate 211; wherein the transparent conductive layer 213 is electrically connected with the frustrated switch 22.

According to the active film layer 21 provided in this embodiment, the flexible substrate 211 is adopted so that the active film layer 21 has a certain deformability, thereby achieving adsorption and desorption by deformation. For example, the active film layer may be Polyimide (PI) film, Biaxially Oriented Polyester (BOPET) film or Cycloolefin Polymer Film (CPF), etc. The transparent conductive layer 213 is electrically connected with the frustrated switch 22. When the frustrated switch 22 is turned on, an electrical signal is input to the transparent conductive layer 213 to maintain the transparent conductive layer 213 at a preset potential, so that the active film layer 21 has electrostatic attraction. For example, the material of the transparent conductive layer 213 is indium tin oxide or zinc aluminum oxide.

Referring to FIGS. 5 and 1, since the side of the active film layer close to the organic light-emitting device 1 may be uneven, the width of the gap d refers to the minimum width of the gap d.

Figure 6:
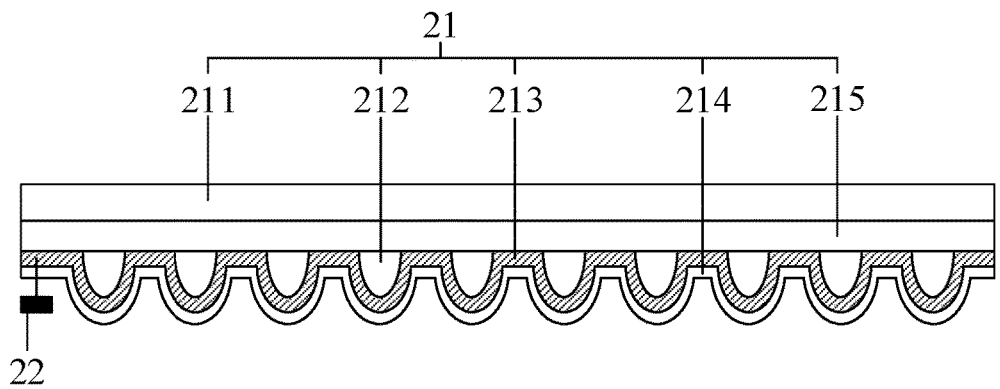
FIG. 6 is a schematic structural diagram of another frustrated total reflection device provided by an embodiment of the present disclosure.

Optionally, referring to FIG. 6, the active film layer 21 further includes a passivation layer 215 between the flexible substrate 211 and the micromirror unit 212. The passivation layer 215 is beneficial to reducing the possibility of fracture of the flexible substrate 211 and the transparent conductive layer 213, thereby prolonging the service life of the active film layer.

Referring to FIG. 5 or 6, in an exemplary embodiment, the material of the micromirror unit 212 includes an organic material with a refractive index of 1.2 to 1.7. For example, positive photoresist may be used to fabricate the micromirror unit 212, and the fabrication process is relatively simple. Or, organic materials such as resin or plastic with a refractive index of 1.2 to 1.7 except positive photoresist may also be used.

Referring to FIG. 5 or 6, in order to improve the light transmittance of the active film layer 21, the height of the micromirror unit 212 may be 2 to 10 microns. The height of the micromirror unit 212 refers to its length in the direction of the organic light-emitting display device toward the active film layer. In order to further improve the light transmittance of the active film layer 21, the distance between two adjacent micromirror units 212 may be 2 to 10 microns.

Figure 7:
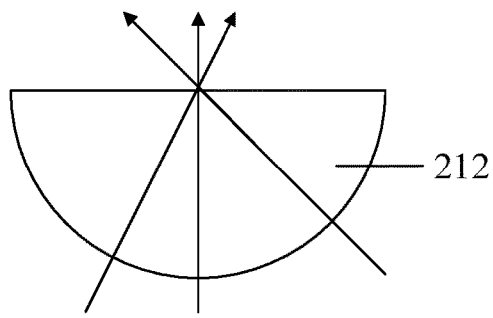
FIG. 7 is a schematic cross-sectional view of a micromirror unit provided by an embodiment of the present disclosure.

For example, the cross section of the micromirror unit 212 in the direction perpendicular to the flexible substrate 211 may be semi-circular, semi-elliptical, sinusoidal or the like. As shown in FIG. 7, taking the cross section of the micromirror unit 212 as a semicircle as an example, when the display light needs to be emitted from the active film layer 21, the display light enters from the curved surface of the micromirror unit 212. At this time, no matter where the display light enters the micromirror unit 212, it can be regarded that the display light directly enters the micromirror unit 212. Therefore, the light emitted by the organic light-emitting display device is hardly reflected in the micromirror unit 212, thereby improving the light transmittance of the active film layer 21.

Figure 8:
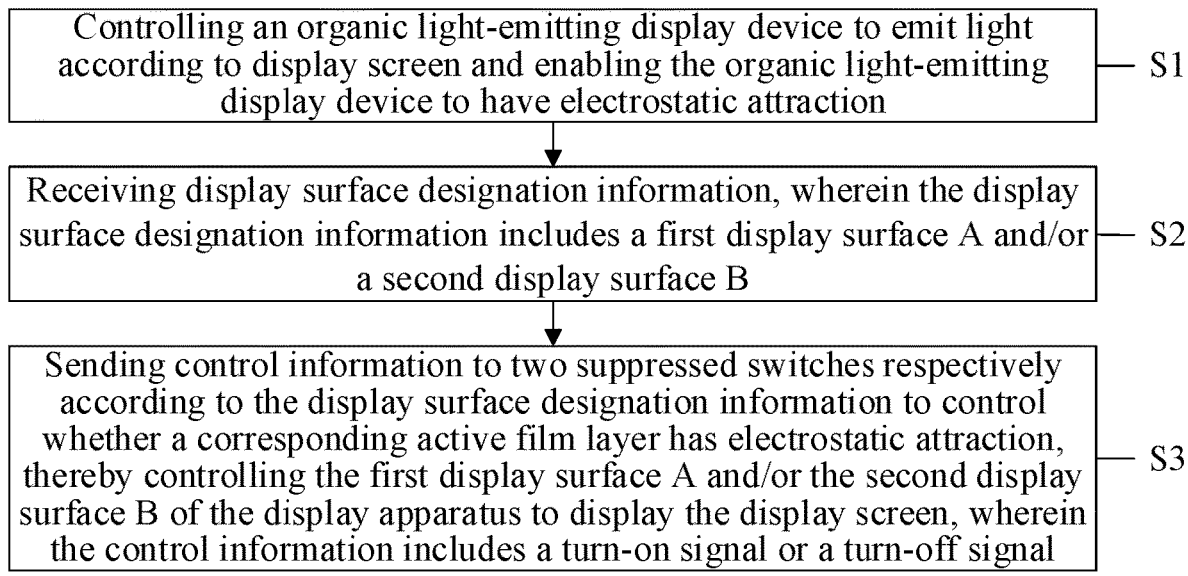
FIG. 8 is a flowchart of a display control method according to an embodiment of the present disclosure.

An embodiment of the present disclosure provides a display control method for controlling the display apparatus to display. Referring to FIGS. 2 and 8, the display apparatus includes a first display surface A and a second display surface B corresponding to two frustrated total reflection devices 2, and the display control method includes steps S1 to S3, wherein:

S1: controlling the organic light-emitting display device 1 to emit light according to a display screen and enabling the organic light-emitting display device to have electrostatic attraction;

S2: receiving display surface designation information, wherein the display surface designation information includes the first display surface A and/or the second display surface B; and S3: sending a control signal to two frustrated switches 22 respectively according to the display surface designation information to control whether a corresponding active film layer 21 has electrostatic attraction, thereby controlling the first display surface A and/or the second display surface B of the display apparatus to display the display screen, wherein the control signal includes a turn-on signal or a turn-off signal.

In an exemplary embodiment, the display surface designation information including the first display surface A and/or the second display surface B means that the display surface designation information includes first designation information designating the first display surface A, second designation information designating the second display surface B, or third designation information designating the first display surface A and the second display surface B. For example, when the display surface designation information includes the first designation information, a turn-on signal is sent to a frustrated switch 22 to control the corresponding active film layer 21 to have electrostatic attraction, thereby controlling the first display surface A of the display apparatus to display the display screen. When the display surface designation information includes the second designation information, a turn-on signal is sent to the other frustrated switch 22 to control the corresponding active film layer 21 to have electrostatic attraction, thereby controlling the second display surface B of the display apparatus to display the display screen. When the display surface designation information includes the third designation information, a turn-on signal is sent to the two frustrated switches 22 to control both active film layers 21 to have electrostatic attraction, thereby controlling the first display surface A and the second display surface B of the display apparatus to display the display screen.

In an exemplary embodiment, the above steps can be reversed, for example, the order of step S1 and step S2 may be interchanged.

According to the display control method provided in this embodiment, whether the corresponding frustrated switch is turned on or not is controlled according to the display surface designation information, so as to control whether the active film layer has electrostatic attraction, and further control whether the corresponding display surface of the display apparatus displays or not, therefore, the switching of single/double-sided display can be simply and quickly achieved.

Referring to FIG. 1 or 2, since the organic light-emitting display device 1 emits the same light to the first display surface A and the second display surface B when emitting light, the display screens viewed by people on the first display surface A and on the second display surface B are mirror images of each other. In order to make it easy to distinguish, the display surface on which the display screen viewed by people is normal is served as the first display surface A, that is, the main display surface. When the display surface designation information includes the first display surface A and the second display surface B, the display control method further includes mirroring the display screen displayed on the second display surface B. The mirrored display screen is then displayed on the second display surface B, and the display screen viewed by people on the second display surface B is the same as that on the main display surface, thereby improving the viewing experience of the user.

Figure 9:
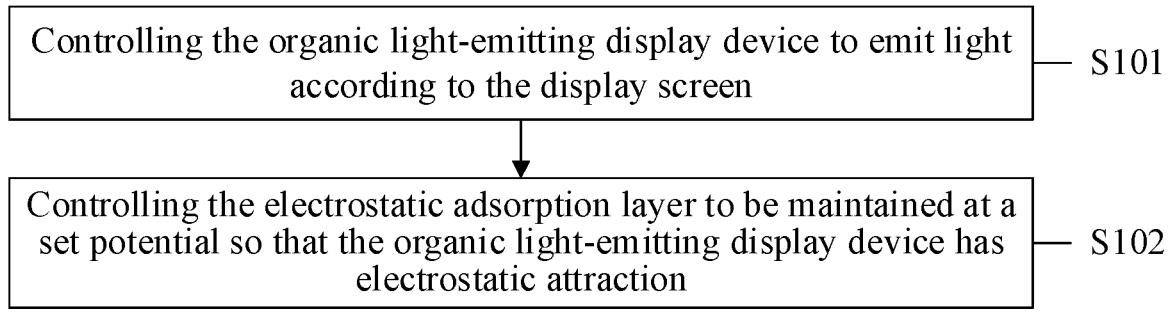
FIG. 9 is a flowchart of a step S1 in the control method shown in FIG. 8.

Optionally, referring to FIGS. 3 and 9, when the organic light-emitting display device further includes a substrate 14, an encapsulation structure 15 and an electrical adsorption layer 16, wherein the substrate 14 is positioned on a side of the transparent anode layer 12 away from the transparent cathode layer 11, the encapsulation structure 15 is positioned on a side of the transparent cathode layer 11 away from the transparent anode layer 12, and the electrical adsorption layer 16 is positioned on a side of the substrate 14 away from the encapsulation structure 15 and/or on a side of the encapsulation structure 15 away from the substrate 14, S1 includes:

S101: controlling the organic light-emitting display device to emit light according to the display screen; and S102: controlling the electrostatic adsorption layer 16 to be maintained at a set potential so that the organic light-emitting display device has electrostatic attraction. In practical application, when there is only one electrostatic adsorption layer 16, it is only necessary to control the electrostatic adsorption layer 16 to be maintained at a set potential; and when two electrostatic adsorption layers 16 are included, the corresponding electrostatic adsorption layer 16 is controlled to be maintained at the set potential according to the display surface designation information.

According to the display control method provided in this embodiment, by controlling the set potential of the additional electrostatic adsorption layer, the organic light-emitting display device has electrostatic attraction.

In an exemplary embodiment, in order to achieve the adsorption between the corresponding active film layer and the organic light-emitting display device, while the corresponding active film layer is turned on, an electrical signal including a preset potential is input to the active film layer to maintain the active film layer at a preset potential, and the electrical property of the preset potential is opposite to the electrical property of the set potential of the electrostatic adsorption layer 16, thereby enabling the active film layer 21 to adsorb the electrostatic adsorption layer 16.

When there is one electrical adsorption layer, in order to make the two active film layers 21 to adsorb the organic light-emitting display device better, the two active film layers may be maintained at different potentials. For example, the difference between the potential of the active film layer closer to the electrical adsorption layer and the set potential of the electrical adsorption layer is smaller than the difference between the potential of the active film layer farther from the electrical adsorption layer and the set potential of the electrical adsorption layer.

When there are two electrical adsorption layers, the distances between the two active film layers and the nearest electrical adsorption layer are basically the same, so when the set potentials of the electrical adsorption layers are the same, the potentials maintained by the two active film layers may be the same.

Figure 10:
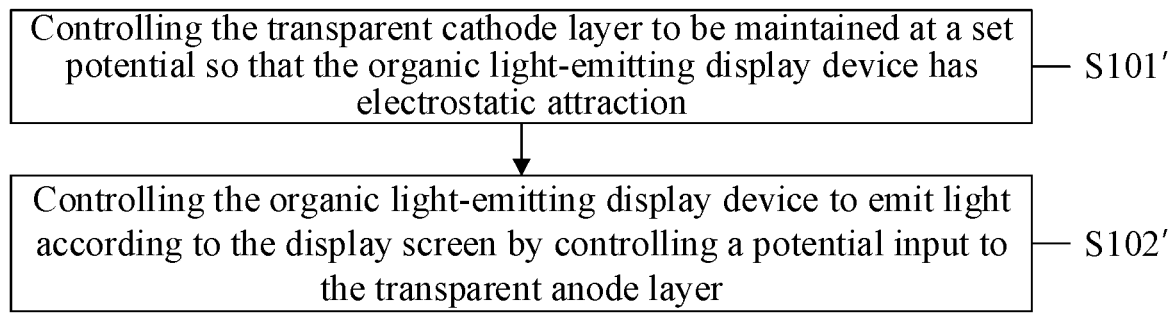
FIG. 10 is a flowchart of another step S1 in the control method shown in FIG. 8.

Optionally, referring to FIGS. 4 and 10, when the transparent cathode layer 15 is reused as an electrical adsorption layer, S1 includes:

S101': controlling the transparent cathode layer 11 to be maintained at a set potential so that the organic light-emitting display device 1 has electrostatic attraction; and S102': controlling the organic light-emitting display device 1 to emit light according to the display screen by controlling a potential input to the transparent anode layer 12.

In this embodiment, the transparent cathode layer is reused as an electrical adsorption layer, so that the organic light-emitting display device can have electrostatic attraction without affecting the display.

The embodiments of the present disclosure can at least achieve the following beneficial effects: according to the display apparatus and the display control method provided in these embodiments, both the cathode layer and the anode layer of the organic light-emitting display device are made of transparent materials, so that the organic light-emitting display device has two opposite display surfaces; a frustrated total reflection device is provided on respective sides of the two display surfaces of the organic light-emitting display device that are away from each other, and a gap is formed by bonding the frustrated total reflection device and the organic light-emitting display device with a sealant; the frustrated total reflection device includes a frustrated switch and an active film layer; whether the light emitted by the organic light-emitting display device can be emitted from the corresponding active film layer may be controlled by controlling the on and off of the corresponding frustrated switch, which not only provides a double-sided display apparatus with simple structure, but also can achieve the controllable switching of single/dual display surfaces of the display apparatus.

Those skilled in the art will understand that various operations, methods, acts in the process, measures and schemes may be alternated, changed, combined or deleted. Further, other acts, measures and schemes in various operations, methods and processes already discussed in the present disclosure may also be alternated, changed, rearranged, divided, combined or deleted. Further, acts, measures and schemes in the related technology having the same functions with those in various operations, methods and processes in the present disclosure may also be alternated, changed, rearranged, divided, combined or deleted.

In the description of the present disclosure, it needs to be understood that, an orientation or position relationship indicated by terms "center", "upper", "lower", "front", "rear", "vertical", "horizontal", "top", "bottom", "inside", "outside", or the like is based on the orientation or position relationship shown in the drawings, and this is only for ease of description of the present disclosure and simplification of the description, rather than indicating or implying that the referred apparatus or element must have a specific orientation, or be constructed and operated in a particular orientation, and therefore this cannot be understood as a limitation on the present disclosure.

The terms "first" and "second" are used for description purposes only, and cannot be interpreted as indicating or implying relative importance or implicitly indicating the quantity of technical features referred to. Thus, features defined by "first" and "second" may include one or more of the features explicitly or implicitly. In the description of the present disclosure, unless otherwise specified, "a plurality of" means two or more.

In the description of the present disclosure, unless otherwise clearly specified and defined, the terms "install", "connect", "couple" should be broadly interpreted, for example, it may be connected fixedly or may be connected detachably, or integrated; it may be directly connected, or may be indirectly connected through an intermediary, or may be an internal connection between two elements. Those of ordinary skill in the art can understand the specific meanings of the above mentioned terms in the present disclosure according to specific situations.

The features, structures, materials, or characteristics described in the present disclosure may be combined in any one or more embodiments or examples in a proper way.

It should be understood that although various acts in the flowcharts of the drawings is shown in the order as indicated by arrows, these acts are not necessarily executed sequentially in the order as indicated by the arrows. Unless explicitly stated herein, the execution of these acts is not strictly limited in order, and may be executed in other orders. Furthermore, at least a part of the acts in the flowcharts of the drawings may include a plurality of sub-acts or stages, which may not necessarily be completed at the same time, but may be executed at different time, and the execution order may not necessarily be carried out sequentially, but may be executed sequentially or alternately with other acts or at least a part of sub-acts or stages of other acts.

The above is only part of the implementation of the present disclosure, and it should be noted that for those of ordinary skill in the art, without departing from the principles of the present disclosure, several improvements and modifications can be made, and these improvements and modifications should also be regarded as covered by the protection scope of the present disclosure.

What is claimed is:

1. A display apparatus, comprising:
   an organic light-emitting display device with electrostatic attraction, comprising a transparent cathode layer, a transparent anode layer and an organic light-emitting layer positioned between the transparent cathode layer and the transparent anode layer;
   frustrated total reflection devices, positioned on both sides of the organic light-emitting display device respectively and each comprising an active film layer and a frustrated switch electrically connected with the active film layer, wherein the frustrated switch is configured to be turned on or off according to a received control signal to control whether the active film layer has electrostatic attraction or not, and the control signal includes a turn-on signal or a turn-off signal; and
   sealants, bonded between the organic light-emitting display device and the frustrated total reflection devices to form gaps between the frustrated total reflection devices and the organic light-emitting display device,
   wherein when the active film layer has electrostatic attraction, the active film layer and the display device are in an adsorption state, so that light emitted by the organic light-emitting display device is emitted from the active film layer; and when the active film layer does not have electrostatic attraction, there is a gap between the active film layer and the organic light-emitting display device to allow light emitted by the organic light-emitting display device to be totally reflected by the gap.

2. The display apparatus according to claim 1, wherein the organic light-emitting display device further comprises:
   a substrate, positioned on a side of the transparent anode layer away from the transparent cathode layer;
   an encapsulation structure, positioned on a side of the transparent cathode layer away from the transparent anode layer; and
   an electrical adsorption layer, positioned on a side of the substrate away from the encapsulation structure and/or on a side of the encapsulation structure away from the substrate, wherein the electrical adsorption layer is maintained at a set potential when the organic light-emitting display device is emitting light to enable the organic light-emitting display device to have electrostatic attraction.

3. The display apparatus according to claim 1, wherein the transparent cathode layer is reused as an electrical adsorption layer, and is maintained at a set potential when the organic light-emitting display device is emitting light to enable the organic light-emitting display device to have electrostatic attraction.

4. The display apparatus according to claim 1, wherein the active film layer comprises:
   a flexible substrate;
   a transparent conductive layer, positioned on a side of the flexible substrate close to the organic light-emitting display device;
   a plurality of micromirror units, positioned between the flexible substrate and the transparent conductive layer and protruding toward the transparent conductive layer; and
   an insulating layer, positioned on a side of the transparent conductive layer away from the flexible substrate,
   wherein the transparent conductive layer is electrically connected with the frustrated switch.

5. The display apparatus according to claim 4, wherein a material of the micromirror units comprises an organic material having a refractive index of 1.2 to 1.7.

6. The display apparatus according to claim 5, wherein a height of the micromirror units is 2 to 10 microns.

7. The display apparatus according to claim 6, wherein a distance between two adjacent micromirror units is 2 to 10 microns.

8. The display apparatus according to claim 5, wherein the active film layer further comprises a passivation layer between the flexible substrate and the micromirror units.

9. The display apparatus according to claim 1, wherein the gap is sealed and in a vacuum state.

10. The display apparatus according to claim 1, wherein a width of the gap is 10 to 100 microns in a direction of the organic light-emitting display device toward the active film layer.

11. A display control method for controlling the display apparatus according to claim 1 to display, the display apparatus comprising a first display surface and a second display surface respectively corresponding to the two frustrated total reflection devices, the display control method comprising:
   controlling the organic light-emitting display device to emit light according to a display screen and enabling the organic light-emitting display device to have electrostatic attraction;
   receiving display surface designation information, wherein the display surface designation information comprises information about the first display surface and/or the second display surface; and
   sending a control signal to two frustrated switches respectively according to the display surface designation information to control whether the corresponding active film layer has electrostatic attraction to further control the first display surface and/or the second display surface of the display apparatus to display the display screen, wherein the control signal comprises a turn-on signal or a turn-off signal.

12. The display control method according to claim 11, wherein the first display surface is a main display surface, and when the display surface designation information comprises the information about the first display surface and the second display surface, the display control method further comprises:

mirroring the display screen displayed on the second display surface.

13. The display control method according to claim 11, when the organic light-emitting display device further comprises a substrate positioned on a side of the transparent anode layer away from the transparent cathode layer, an encapsulation structure positioned on a side of the transparent cathode layer away from the transparent anode layer, and an electrical adsorption layer positioned on a side of the substrate away from the encapsulation structure and/or on a side of the encapsulation structure away from the substrate, controlling the organic light-emitting display device to emit light according to the display screen and enabling the organic light-emitting display device to have electrostatic attraction comprises:

controlling the organic light-emitting display device to emit light according to the display screen; and controlling the electrostatic adsorption layer to be maintained at a set potential to allow the organic light-emitting display device to have electrostatic attraction.

14. The display control method according to claim 11, wherein when the transparent cathode layer is reused as an electrical adsorption layer, controlling the organic light-emitting display device to emit light according to the display screen and enabling the organic light-emitting display device to have electrostatic attraction comprises:

controlling the transparent cathode layer to be maintained at a set potential to allow the organic light-emitting display device to have electrostatic attraction; and controlling the organic light-emitting display device to emit light according to the display screen by controlling a potential input to the transparent anode layer.

15. The display apparatus according to claim 2, wherein the active film layer comprises:

a flexible substrate;

a transparent conductive layer, positioned on a side of the flexible substrate close to the organic light-emitting display device;

a plurality of micromirror units, positioned between the flexible substrate and the transparent conductive layer and protruding toward the transparent conductive layer; and an insulating layer, positioned on a side of the transparent conductive layer away from the flexible substrate, wherein the transparent conductive layer is electrically connected with the frustrated switch.

16. The display apparatus according to claim 3, wherein the active film layer comprises:

a flexible substrate;

a transparent conductive layer, positioned on a side of the flexible substrate close to the organic light-emitting display device;

a plurality of micromirror units, positioned between the flexible substrate and the transparent conductive layer and protruding toward the transparent conductive layer; and an insulating layer, positioned on a side of the transparent conductive layer away from the flexible substrate, wherein the transparent conductive layer is electrically connected with the frustrated switch.

* * * * *